(12) United States Patent
Chen et al.

(10) Patent No.: US 7,045,256 B2
(45) Date of Patent: May 16, 2006

(54) QUARTZ DAMAGE REPAIR METHOD FOR HIGH-END MASK

(75) Inventors: Same-Ting Chen, Hsinchu (TW); Zy Ying Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 223 days.

(21) Appl. No.: 10/425,322

(22) Filed: Apr. 29, 2003

(65) Prior Publication Data

US 2003/0203292 A1 Oct. 30, 2003

Related U.S. Application Data

(63) Continuation-in-part of application No. 10/134,822, filed on Apr. 26, 2002, now Pat. No. 6,555,277.

(51) Int. Cl.
G03F 9/00 (2006.01)
G03C 5/00 (2006.01)

(52) U.S. Cl. .................... 430/5; 430/316; 430/318
(58) Field of Classification Search .............. 430/5, 430/316, 318
See application file for complete search history.

(56) References Cited

U.S. PATENT DOCUMENTS

| 5,965,301 A | 10/1999 | Nara et al. ............. 430/5 |
| 5,965,303 A | 10/1999 | Huang .................. 430/5 |
| 6,103,430 A | 8/2000 | Yang ................... 430/5 |
| 6,190,836 B1 | 2/2001 | Grenon et al. .......... 430/311 |

*Primary Examiner*—Christopher G. Young
(74) *Attorney, Agent, or Firm*—Thomas, Kayden, Horstemeyer & Risley

(57) ABSTRACT

A method is provided for repairing photolithographic exposure masks. A focused ion-beam exposure of the surface of the exposure mask is used to purposely "damage" this surface over the area where opaque or light-blocking material is required to be present.

24 Claims, 4 Drawing Sheets

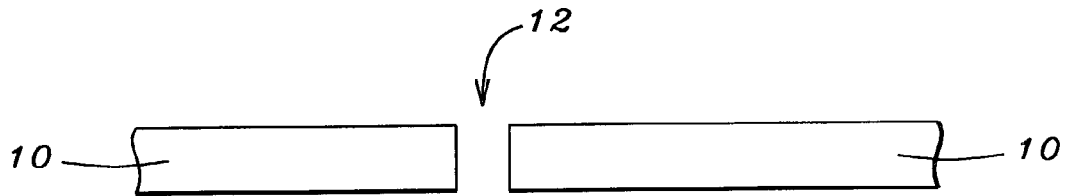
FIG. 1a – Prior Art
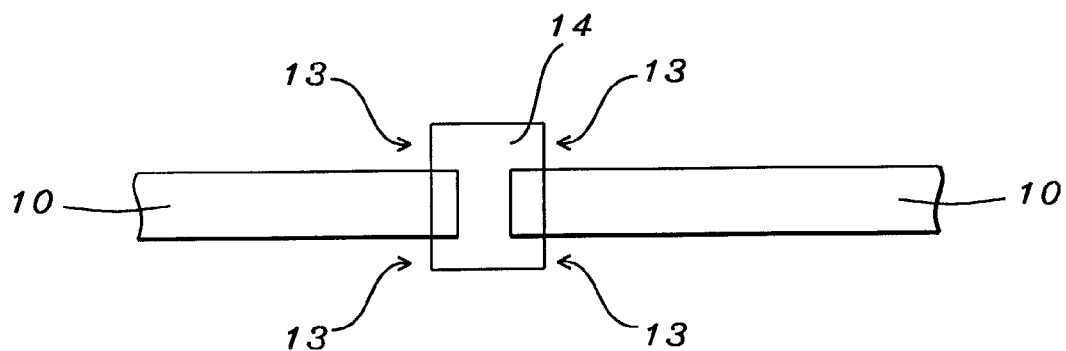
FIG. 1b – Prior Art
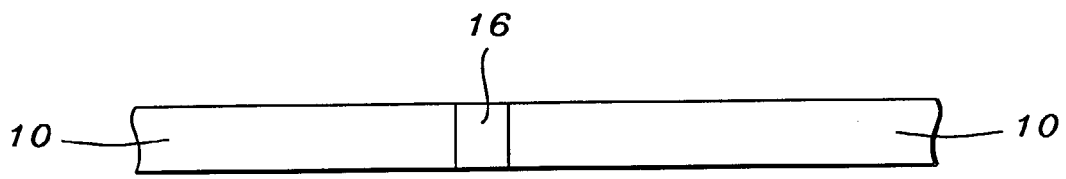
FIG. 1c – Prior Art
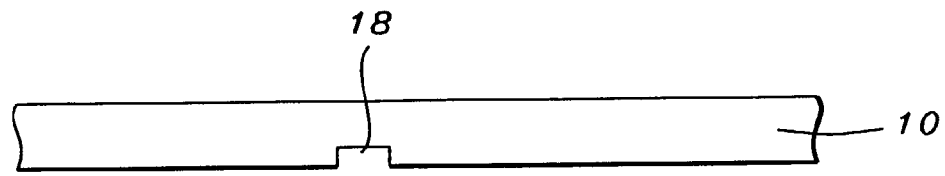
FIG. 2a – Prior Art

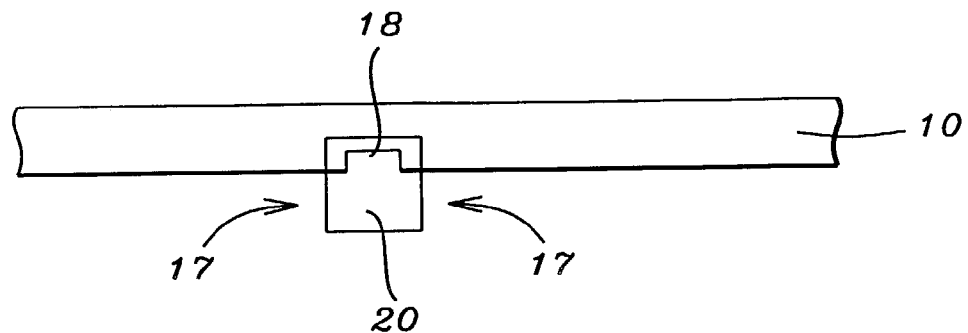
FIG. 2b – Prior Art
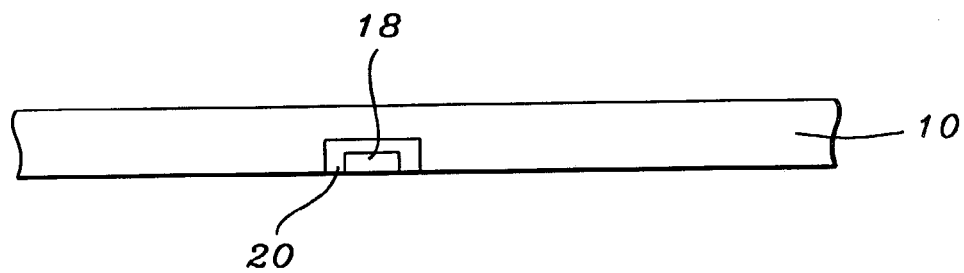
FIG. 2c – Prior Art
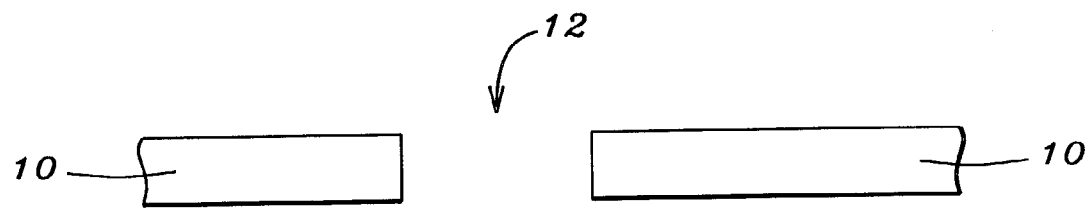
FIG. 3a
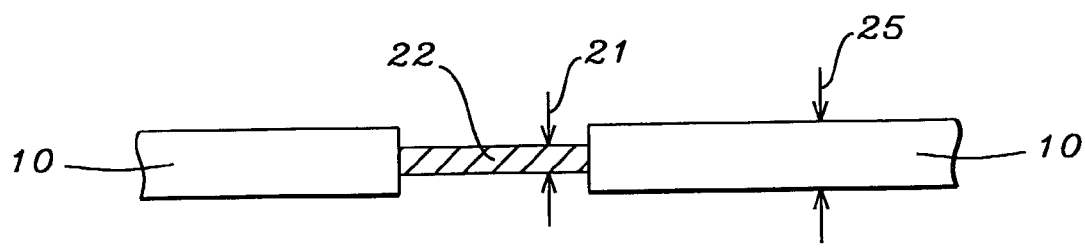
FIG. 3b

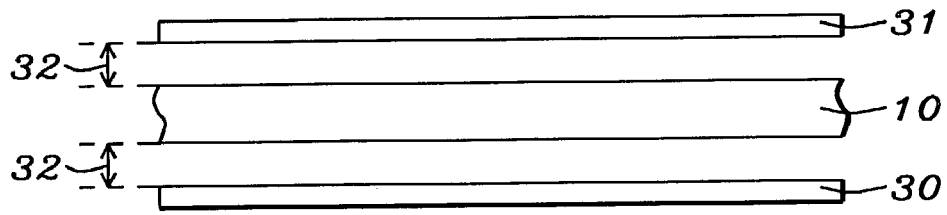
*FIG. 5a – Prior Art*
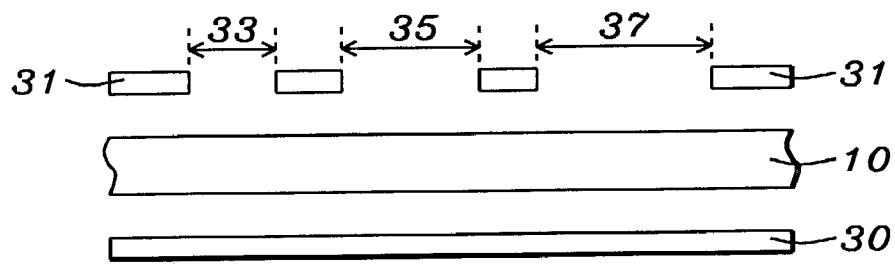
*FIG. 5b – Prior Art*
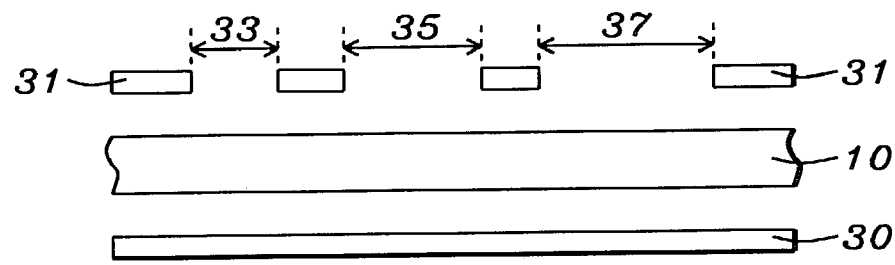
*FIG. 6a*
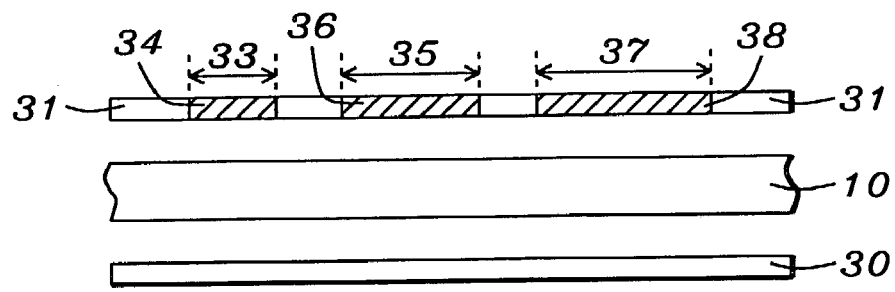
*FIG. 6b*

QUARTZ DAMAGE REPAIR METHOD FOR HIGH-END MASK

This application is a Continuation-in-Part of Ser. No. 10/134,822 (now U.S. Pat. No. 6,555,277, issued Apr. 29, 2003), filing date Apr. 26, 2002.

BACKGROUND OF THE INVENTION (1) Field of the Invention

The invention relates to the fabrication of integrated circuit devices, and more particularly, to a method of repairing high-end quartz masks.

(2) Description of the Prior Art

One of the most essential components that is used during the process of performing photolithographic exposures is a photomask that contains patterns that need to be transposed from the mask to underlying layers of semiconductor material such as most notably the surface of a layer of photoresist. The standard mask comprises a transparent substrate on the surface of which a patterned layer of opaque material has been created. Typically used for the opaque material is chromium that has been deposited over the quartz substrate to a thickness of about 1,000 Angstroms.

Alternate opaque materials for the creation of the patterned layer on the surface of a photolithographic mask are nickel and aluminum. For the substrate quartz is typically used, however glass and sapphire can also be used for this purpose.

More sophisticated photo masks apply the principle of phase shifting of the light as the light passes through the mask for the purpose of creating device features of sub-micron dimensions. In these Phase Shifting Masks (PSM) the projected light that is in extreme close physical proximity is mutually interactive, having a detrimental effect on the definition of the exposed pattern.

As a further advance, alternate phase shifting masks can be used, where the phase shifting characteristic of the phase shifting mask is alternately applied to the light as the light passes through the photo mask. A further level of sophistication is introduced by the use of regions on the substrate of the photomask that pass light in a graded manner. The light that passes through the mask can in this case be controlled so that not only complete passing or complete blocking of light takes place but that the mask also provides a graded exposure. This graded exposure may for instance be of use in creating dual damascene structures, where depth of light exposure can be used for non-uniform removal of a layer of photoresist over the thickness of the layer of photoresist.

The photolithographic mask is created using conventional methods of depositing (including sputtering) a layer of opaque material over a surface of the substrate of the mask and patterning this layer using conventional high resolution methods of exposure such as E-beam exposure. Due to the frequently used high density of the pattern that is developed in the layer of opaque material, this formation is exposed to a number of problems that result in bad and unusable masks.

These masks are frequently repaired, based on a cost analysis as to whether it is best (most cost effective) to repair the mask or whether it is best to scrap the defective mask.

Defects that can occur in the creation of an opaque pattern over the surface of a substrate are opaque material remaining in place where it should be removed and visa versa, the formation of an interconnect or bridge between closely spaced adjacent lines of the opaque pattern, extensions of the opaque material into transparent surface regions of the mask, the occurrence of an isolated opaque spot in a transparent region and visa versa, the formation of pin holes in either the opaque or the transparent surface area and the like.

A number of methods have been provided for the repair of photo masks. In view of the density and the potential complexity of the pattern that has been created on the substrate of the photo mask, this process however can be cumbersome, time consuming and expensive. The invention provides a method that is reliable and can be readily made part of a semiconductor manufacturing environment.

U.S. Pat. No. 6,190,836 B1 (Grenon et al.) discloses a method for repairing a photomask.

U.S. Pat. No. 6,103,430 (Yang) reveals a method to repair a PSM.

U.S. Pat. No. 5,965,301 (Nara et al.) shows a method to remove a residual defect in a mask.

U.S. Pat. No. 5,965,303 (Huang) shows another PSM repair method.

SUMMARY OF THE INVENTION

A principle objective of the invention is to provide a method of repairing photolithographic exposure masks that is cost effective to implement.

Another objective of the invention is to provide a method of repairing photolithographic exposure masks that has high accuracy of repair.

Yet another objective of the invention is to provide a method of repairing photolithographic exposure masks that eliminates concerns of peeling of opaque material after the repair has been performed.

In accordance with the objectives of the invention a new method is provided for repairing photolithographic exposure masks. The invention uses an etch function of a conventional mask repair tool. The invention addresses defects that occur in a pattern of opaque material (such as chrome) created over the surface of an exposure mask whereby an (undesired) opening exists in the opaque material. The invention uses a focused ion-beam exposure of the surface of the exposure mask to purposely "damage" this surface over the area where the opaque material is required to be present. Repair accuracy is in this manner easy to control, the conventional problem of peeling of the opaque or light sensitive material is eliminated.

BRIEF DESCRIPTION OF THE DRAWINGS

FIGS. 1a through 1c show conventional repair of a clear of open line defect.

FIGS. 2a through 2c show conventional repair of an opaque or intrusion defect.

FIGS. 3a through 3c show repair of a clear of open line defect in accordance with the invention.

FIGS. 5a and 5b show a top view of a prior art opaque line over an exposure mask, scattering lines are provided adjacent to the opaque line. FIG. 5b shows interruptions or defects of one of the scattering lines.

FIGS. 6a and 6b show a top view of an opaque line over an exposure mask, an interrupted scattering line is present adjacent to the opaque line, the interrupted scattering line needs to be repaired. FIG. 6b shows a top view of the exposure mask after the scattering line has been repaired by the invention.

DESCRIPTION OF THE PREFERRED EMBODIMENTS

Figure 3C:
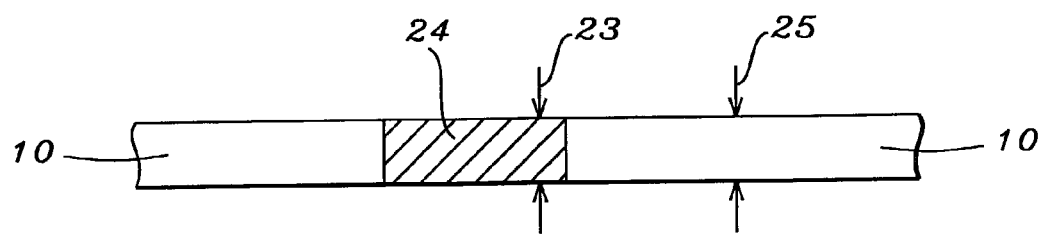

Required improvements in semiconductor product performance can only be achieved by designing devices having smaller device dimensions. The smaller dimensions that are required for advanced semiconductor devices can only be achieved if these smaller dimensions are reflected in the photolithographic imaging masks that are used to create the device features of reduced dimensions. Photolithographic masks must therefore be designed having on the surface thereof smaller and higher-density patterns. This brings with it that repair of a pattern on the surface of an exposure mask is more difficult when using conventional methods and tools of repair for exposure masks that are used for the creation of advanced, deep sub-micron semiconductor devices.

Typical repairs of a chromium or phase shift mask address two problems that are experienced with these mask, that is clear defects in which portions of the light-absorbing chromium are missing and opaque defect or defects of intrusion in which extra chromium is located on the quartz substrate. Current practice uses a Focused Ion Beam (FIB) tool to affect the repair, clear defects are repaired with FIB induced deposits of an opaque carbon film of for instance polystyrene while opaque defects are repaired by sputtering away the excess and misplaced chromium deposits.

These current repair methods have two significant shortcomings:

the accuracy of deposition is limited for smaller, denser patterns, resulting in over-deposition of the carbon film, which creates a large effective Critical Dimension of the corrected line pattern, and the deposited material tends to peel after deposition and after normal clean.

In repairing a clear defect in the opaque surface area of a mask, there is a limit to the accuracy of the deposition of the corrective material that is typically required for repairing of the clear defect. It is common to experience over-diffusion or spreading of the deposited corrective material. In this case the deposited material will diffuse over the surface of the exposed, normal quartz area. This diffusion is corrected by etching the surface of the quartz substrate in order to remove the diffused materials from this surface. The etching of the diffused surface area of the quartz mask however typically results in damage to the surface of the quartz substrate, creating a surface area of low or no light transmittance where in fact this surface area is supposed to be a clear or light transmitting surface area. This surface area, of impaired light passing capability, will become part of the exposing surface area of the mask, leading to exposures that are either of low quality or that are unacceptable.

The current method of repairing a broken line of chromium over the surface of a photolithographic mask is shown in FIGS. 1a through 1c, as follows, FIG. 1a:

10 is the line that must be repaired 12 is the opening or interruption in line 10 which must be repaired, further, FIG. 1b:

14 is the material (chromium) that has been deposited over the surface of the quartz substrate in order to repair opening 12

13 are the surface areas of the quartz substrate over which the repair material (chromium) is deposited where this repair material is not required for the repair of opening 12; the repair material must be removed from these surface areas 13, the surface areas 13 can be described as the surface areas of the quartz substrate over which excess and not needed repair material 14 has been deposited; surface areas 13 therefore are areas of deposition of repair material 14 that fall outside the surface area of the quartz substrate over which the undamaged line 10 existed, further FIG. 1c:

16, the remaining repair material after excess repair material has been removed from the previously highlighted surface areas 13 of the quartz substrate.

The surface of the quartz substrate that underlies the areas 13 is the surface that is typically damaged due to the etch that is required to remove the excess repair material from areas 13.

FIGS. 2a through 2c show the prior art process for the repair of, FIG. 2a, an intrusion 18 onto the line 10. A layer 20, FIG. 2b, of repair material is deposited over the intrusion 18 and etched from surface areas 17 where the repair material does not cover the surface of the undamaged line 10, FIG. 2c. The surface area of the quartz substrate from which the excess repair material has been removed is in this case equally prone to damage, resulting in a mask having impaired light transmitting characteristics.

The above highlighted surface regions 13 (FIG. 1b) and 17 (FIG. 2b) are the depositions of the chromium where this chromium does not accurately overlay the opening 12 (FIG. 1a) or the intrusion 18 (FIG. 2a). The corrective layers 16 of FIG. 1c and 20 of FIG. 2c are, as previously stated, prone to peel from the surface of the mask after the repair has been affected, causing new and perhaps even more serious concerns relating to the usability of the photo mask after the repair of the mask has been completed.

The etch process that is typically used for the removal of excess deposited chromium uses as etch components Ga or $Br_2$ for binary mask or $XeF_2$ for a PSM mask and $SiO_2$. Of these etch components the elements Ga and $Br_2$ or $XeF_2$ are known to chemically interact with the surface of the quartz substrate of the mask, causing the above referred to damage to the surface of the quartz substrate.

The invention provides a method that addresses the above stated issues and that overcomes the highlighted difficulties for the repair of advanced photolithographic exposure masks.

The invention addresses the repair of clear and opaque defects by utilizing the etch function of a standard repair tool. The invention damages the surface of the exposure mask over the surface area where the opaque material, such as chrome, is supposed to be present. This "damage" of the surface of the quartz exposure mask is achieved using a Focused Ion Beam (FIB) tool. By selectively exposing the surface of the quartz exposure mask using the FIB tool, the exposed surface area will be converted to an opaque surface, thus replacing the opaque function of the (missing) opaque material over the surface of the quartz exposure mask.

The method of the invention is referred to as the Quartz-Damage Repair (QDR) method, which will now be explained in detail.

FIGS. 3a through 3c and FIGS. 4a through 4c are used to further explain the invention.

Shown in FIG. 3a are:

10, the line that must be repaired 12, the opening or interruption in line 10 which must be repaired, further, FIG. 3b:

22, the area of the quartz that is exposed due to the opaque material, such as chrome, not being present over this surface area (a chrome defect); this surface area is targeted for an etch using the FIB etch tool; the target area 22 is etched, preferably over the length of the opening but preferably only over a width 21 that is between about ⅔ and ¾ of the width 25 of the opening 12, and further, FIG. 3c:

24, the resulting damaged quartz area after the FIB etch, which has a width 23 that is approximately equal to the width 25 of the chrome pattern 10.

The mask that is shown in cross section in FIG. 3a has been described as being a mask that uses quartz as the material for the substrate of the mask. This mask however is not limited to using quartz as the material for the substrate of the mask but can equally make use of glass and sapphire for the creation of the substrate of the mask. In addition, the mask may be a binary mask or a phase-shift mask or a gray-tone mask that provides grade light passing capabilities from transparent to opaque and any intermediate degree of light blocking for a pattern or parts of a pattern on the surface of the exposure mask.

A brief overview of the creation of a phase shift mask is of value at this time. A layer of opaque material such as chromium is deposited over the substrate of the mask, typically of quartz or other silica based material. The chromium is etched, creating a pattern in the chromium. The quartz of the substrate is etched in a fluorine based plasma, using the resist of the etch of the chromium as a mask. The resist is then stripped, the chromium is removed by a dry or wet process leaving the phase shift mask of quartz etched in the quartz substrate of the mask.

As an alternate to etching the pattern for the phase shift mask in the surface of the substrate, a layer of phase shifter material can be deposited on this surface and can be patterned and etched using conventional methods to create the pattern of phase shifter material.

Gray Tone Masks (GTM) can in similar manner be created by creating layers of varying light passing characteristics on the surface of the substrate of the exposure mask. By varying the thickness of the overlying layers on the surface of the mask the light density that is allowed to pass through the mask can be made to vary.

The above-indicated sequence of repairing an interrupted line of chromium on the surface of a quartz substrate has the following advantages, some of which have already been highlighted:

the accuracy of the repair is improved since this accuracy is now determined by the etch accuracy of the quartz that is used for purposes of repair; an overetch can be applied if this is desired, whereby with overetch is implied that the etch may damage the quartz from an area that surrounds the actual interruption of chromium in the interrupted line; this overetch does not introduce any negative effects but allows a relaxation of requirements of accuracy of the applied etch typically experienced peeling of the deposited materials (such as polystyrene) that has been deposited in order to affect a repair is eliminated; this since the etch of the invention does not apply any new material the most stringent requirement of accuracy that is required for the repair are placed on the tool that affects the etch of the quartz.

Figure 4A:
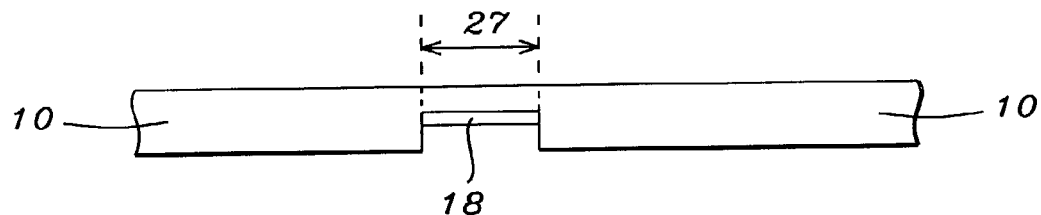
FIGS. 4a through 4c show repair of an opaque or intrusion defect in accordance with the invention.
Figure 4B:
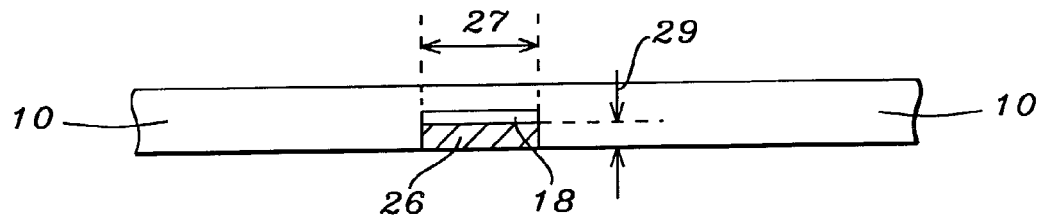
Figure 4C:
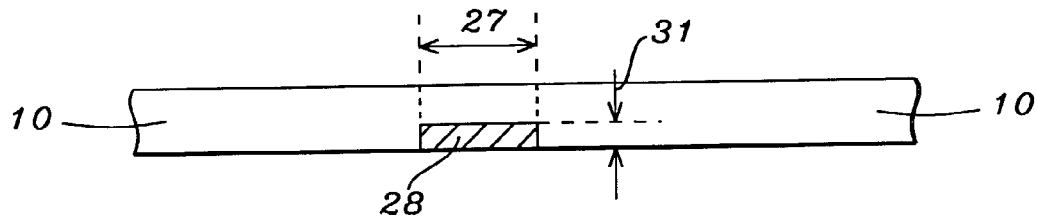

FIGS. 4a through 4c show a process for repair of an intrusion that is similar to the process highlighted above for a broken line, as follows, FIG. 4a:

10, the line that must be repaired

18, an intrusion defect in line 10 which must be repaired, intrusion defect 18 has a length of 27, further, FIG. 4b:

26, the FIB target area of quartz damage, having a length 27 and a width of 29, further, FIG. 4c:

28, the final dimension of the damaged quartz where the quartz has been converted to a non-light transmitting or opaque surface, having a length of 27 and a width 31, which is equal to between about ⅔ and ¾ the value of 29 (FIG. 4b).

Experimental results have been obtained in order to confirm the effectiveness of the invention. These experimental results are shown next and have been obtained using a Micro-lithography Simulation Microscope (MSM). The Critical Dimensions (CD) of lines have been measure using the MSM, a target CD of 0.2 μm has been used for comparative purposes. A broken line has been repaired using the invention, measured after the repair has been performed was a CD value of 0.204 μm. Further, a line having an intrusion has been repaired using the invention, measured after the repair has been performed was a CD value of 0.198 μm. It has been found that the CD of repaired lines using the invention is between 2 and 4 nm different than the CD of non-damaged lines.

These results, in addition to the gained advantages of elimination peeling of deposited opaque materials, make the method of the invention suitable for the repair of photolithographic masks that are used for the creation of deep sub-micron line and other patterns.

It is further known in the art that photolithographic imaging uses scattering bars on the exposure mask as a method of affecting the polarization of the light passing through the mask. In this sense the term polarization of light is used to refer to the process of affecting light so that, for instance, its waves vibrate in one plane only. Polarization in its broadest application can make use of, among others, light reflection, double detraction of light, selective absorption of light and scattering of light affected by creating scattering bars over the surface of an exposure mask substrate as part of the opaque pattern of the exposure mask.

FIGS. 5a and 5b show a top view of a line 10 of opaque material that has been created over an exposure mask, further shown are two scattering lines 30 and 31 that are parallel with line 10 and that are located on opposite sides of line 10, separated from line 10 by a distance 32.

FIG. 5b shows a top view of line 10 whereby in this instance interruptions or defects 33, 35 and 37 of scattering line 31 are highlighted. These interruptions 33, 35 and 37 of the scattering line 31, which typically result in necking and in local shrinkage of the Critical Dimension (CD) of the created images, are repaired by the invention.

Interruptions 33, 35 and 37 have purposely been highlighted as being of different lengths in order to indicate that the invention has experimented with and allows for the repair of a range of lengths of the interruptions of scattering lines.

The conventional method of repairing scattering lines has been highlighted above and follows the convention method of repairing line 10 as shown in FIGS. 1a through 1c. This conventional method of repair presents the conventional and unacceptable disadvantages of repair that also have been highlighted above. The essential points of this process are briefly reviewed at this time.

The current process to repair defects in a scattering bar, defects that are shown in the top view of scattering bar 31 in FIG. 5b, is to use a Focused Ion Beam (FIB) tool for the deposition of an opaque film, such as a carbon film, over the interruption (in the scattering bar), in this manner blocking light transmission through the interruption and restoring the scattering bar to its original function of blocking light transmission there-through.

The deposited (light blocking) film will however readily diffuse, which has a negative impact on the critical exposure mask performance parameter of Optical Proximity Correct (OPC).

Moreover, in view of the extreme sub-micron dimensions of the scattering bars of an exposure mask and therefore in view of the requirement to limit the deposition of the opaque film to extreme sub-micron dimensions, the deposited opaque film will more readily peel from the exposure mask after this mask has been cleaned.

Due to the extreme sub-micron dimensions of the scattering bars of an exposure mask the repair of interruptions in a scattering bar presents a challenge. The invention addresses this issue and provides a method for the repair of interrupted scattering bars that have been provided as part of an exposure mask.

Missing or interrupted scattering bars typically results in necking, that is excessive rounding around the turning points (or intersects) of created intersecting lines, and in local shrinkage of the Critical Dimension (CD) of the created images such as line images.

The method provided by the invention for the repair of a scattering bar provides for a repair method in which no chemical depositions are used. In its place, the invention provides for etching the surface of the exposure mask substrate over the surface area where a scattering bar interruption exists and in this manner restores the non-light transmitting characteristic of the scattering bar over the etched surface of the exposure mask.

Comments and details that have been provided above, as these comments and details relate to the invention as described using FIGS. 3a through 3c, are, where these comments and details are applicable to the descriptions of FIGS. 6a and 6b, enclosed at this time by reference thereto as being equally valid for the descriptions of FIGS. 6a and 6b.

FIGS. 6a and 6b show the process of the invention, wherein specifically is shown in FIG. 6a a top view of a line 10 of opaque material of an exposure mask. Further shown are two scattering lines 30 and 31 that are parallel to line 10 and located on opposite sides of line 10, separated from line 10 by a distance 32. FIG. 6a shows damaged scattering line 31 before the repair of the invention is applied to this damaged scattering line 31.

FIG. 6b shows a top view of the same lines as are shown in top view in FIG. 6a but now the scattering liner 31 has been repaired by etching the surface areas 34, 36 and 38 of the substrate of the exposure mask. The etching of the surface of the substrate of the exposure mask roughens the surface of the substrate over surface areas 34, 36 and 38, restoring the required blocking of scattering line 31 over the interruptions 33, 35 and 37, and restoring line 31 to it required function as a scattering line.

For the etch of the substrate of the exposure mask, the invention provides bromine or $XeF_2$.

Applying the method of the invention, it has been confirmed that this method provides a Depth Of Focus (DOF) performance of the repaired exposure mask that is comparable with the DOF of an undamaged mask. Furthermore, the method of the invention provides a Critical Dimension variation between the repaired exposure mask and an undamaged mask of less than 3 nm, which is within acceptable limits.

The invention has been applied to repairing interrupted scattering lines whereby the dimensions of interruptions 31, 33 and 35 have been selected between 0.5 μm and 1.5 μm. In addition, the invention can be varied by using various operating conditions of the applied FIB tool, in this manner establishing the optimum conditions for implementing the repair method of the invention. As control parameters for establishing optimum FIB operating conditions can be used the light intensity of the repaired scattering bar as compared with an operational scattering bar, for this light intensity observation a Micro Lithographic Simulation Microscope (MSM) is preferably applied.

The invention, of repairing scattering lines, in sum provides for:
1. a method that is easy to implement
2. a method that provides close control of the Critical Dimensions (CD) of the scattering lines
3. does not require chemical depositions
4. reduces the CD deviation of an exposure mask that has faulty scattering lines from between about 5 and 13 nm to between about 3 and 7 nm after the faulty scattering lines have been repaired
5. restores the Depth Of Focus (DOF), which is unacceptable in a exposure mask having interrupted scattering lines, by reducing the DOF between about 0.3 μm and 0.4 μm, resulting in a wafer loss that is limited to 0.1 μm DOF failures, and
6. a method that removes concerns of peeling of opaque material after the repair has been affected.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of repairing a photolithography mask, capable of creating device features having deep-sub-micron dimensions, comprising:
    providing a photolithographic mask having a substrate and a pattern of light-blocking material created on the substrate, wherein the pattern of light-blocking material comprises at least one damaged scattering bar pattern of a scattering bar pattern with a width and at least one interruption with a length therein, exposing a surface of the substrate; and
    etching the surface over the substrate of the interruption, wherein the etching is achieved by Focused Ion Beam (FIB) technology and extends over the width of the at least one scattering bar pattern and the length of the at least one interruption.

2. The method of claim 1, wherein the photolithographic mask provides the pattern or parts of the pattern of light-blocking material with grade light passing capabilities from transparent to opaque or any intermediated degree therebetween.

3. The method of claim 2, wherein the photolithographic mask is a phase shift mask, binary mask, or a Gray-Tone mask.

4. The method of claim 1, wherein the substrate comprises quartz, glass, or sapphire.

5. A method of repairing a photolithography mask, capable of creating device features having deep-sub-micron dimensions, comprising:
    providing a photolithographic mask having a substrate and a pattern of opaque material created on the substrate, wherein the pattern of opaque material comprises at least one damaged scattering bar pattern of a scattering bar pattern with a width and at least one interruption with a length therein, exposing a surface of the substrate; and etching the surface over the substrate of the interruption, wherein the etching is achieved by Focused Ion Beam (FIB) technology and extends over the width of the at least one scattering bar pattern and the length of the at least one interruption.

6. The method of claim 5, wherein the opaque material comprises chromium, nickel, or aluminum.

7. The method of claim 5, wherein the photolithographic mask is a binary mask.

8. The method of claim 5, wherein the substrate comprises quartz, glass, or sapphire.

9. A method of repairing a photolithography mask, capable of creating device features having deep-sub-micron dimensions, comprising:

providing a photolithographic mask having a substrate and a pattern of opaque material created on the substrate, wherein the pattern of opaque material comprises at least one damaged portion with a width and a length therein, exposing a surface of the substrate, wherein the damaged portion is an interruption or an intrusion; and etching the surface over the substrate of the damaged portion, wherein the etching is achieved by Focused Ion Beam (FIB) technology and extends over the width and the length thereof.

10. The method of claim 9, wherein the opaque material comprises chromium, nickel, or aluminum.

11. The method of claim 9, wherein the photolithographic mask is a binary mask.

12. The method of claim 9, wherein the etching uses bromine or $XeF_2$.

13. The method of claim 9, wherein the substrate comprises quartz, glass, or sapphire.

14. A method of repairing a photolithography mask, capable of creating device features having deep-sub-micron dimensions, comprising:

providing a photolithographic mask having a substrate and a pattern of phase shifter material created on the substrate, wherein the pattern of phase shifter material comprises at least one damaged scattering bar pattern of a scattering bar pattern with a width and at least one interruption with a length therein, exposing a surface of the substrate; and etching the surface over the substrate of the interruption, wherein the etching is achieved by Focused Ion Beam (FIB) technology and extends over the width of the at least one scattering bar pattern and the length of the at least one interruption.

15. The method of claim 14, wherein the etching uses bromine or $XeF_2$.

16. The method of claim 14, wherein the substrate comprises quartz, glass, or sapphire.

17. A method of repairing a photolithography mask, capable of creating device features having deep-sub-micron dimensions, comprising:

providing a photolithographic mask having a substrate and a pattern of material of varying light passing characteristics created on the substrate, wherein the pattern of material of varying light passing characteristics comprises at least one damaged scattering bar pattern of a scattering bar pattern with a width and at least one interruption with a length therein, exposing a surface of the substrate; and etching the surface over the substrate of the interruption, wherein the etching is achieved by Focused Ion Beam (FIB) technology and extends over the width of the at least one scattering bar pattern and the length of the at least one interruption.

18. The method of claim 17, wherein the photolithographic mask is a gray-tone mask.

19. The method of claim 17, wherein the etching uses bromine or $XeF_2$.

20. The method of claim 17, wherein the substrate comprises quartz, glass, or sapphire.

21. A method of repairing a photolithography mask, capable of creating device features having deep-sub-micron dimensions, comprising:

providing a photolithographic mask having a substrate add a pattern of material of varying light passing characteristics created on the substrate, wherein the pattern of material of varying light passing characteristics comprises at least one damaged scattering bar pattern of a scattering bar pattern with a width and at least one interruption with a length therein, exposing a surface of the substrate; and etching the surface over the substrate of the interruption, wherein the etching is achieved by Focused Ion Beam (FIB) technology and extends over the width of the at least one scattering bar pattern and the length of the at least one interruption.

22. The method of claim 17, wherein the photolithographic mask is a gray-tone mask.

23. The method of claim 17, wherein the etching uses bromine or $XeF_2$.

24. The method of claim 17, wherein the substrate comprises quartz, glass, or sapphire.

* * * * *